United States Patent [19]
Budman et al.

[11] Patent Number: 5,276,590
[45] Date of Patent: Jan. 4, 1994

[54] FLEX CIRCUIT ELECTRONIC CARDS

[75] Inventors: Mark Budman, Vestal; Mark J. Kuzawinski, Maine; Douglas M. Saunders, Broome, all of N.Y.

[73] Assignee: International Business Machines Corporation, Armonk, N.Y.

[21] Appl. No.: 782,216

[22] Filed: Oct. 24, 1991

[51] Int. Cl.$^5$ .............................................. H05K 7/14
[52] U.S. Cl. ................................... 361/796; 361/748; 361/761; 361/829; 439/67; 439/77; 174/250
[58] Field of Search ............................ 361/380, 395-; 439/67, 76, 77; 174/250; 257/723; 211/41

[56] References Cited

U.S. PATENT DOCUMENTS

| | | | |
|---|---|---|---|
| 3,631,325 | 12/1971 | Wenz | 317/100 |
| 4,026,011 | 5/1977 | Walton | 29/625 |
| 4,064,552 | 12/1977 | Angelucci | 361/414 |
| 4,742,431 | 5/1988 | Igarashi | 361/398 |
| 4,781,601 | 11/1988 | Kuhl et al. | 439/77 |
| 4,792,879 | 12/1988 | Bauknecht et al. | 361/424 |
| 4,834,660 | 5/1989 | Cotti | 439/67 |
| 4,895,524 | 1/1990 | Thepault | 439/74 |
| 4,928,206 | 5/1990 | Porter et al. | 361/335 |
| 4,958,050 | 9/1990 | Okn et al. | 174/261 |
| 5,010,450 | 4/1991 | Werdin et al. | 361/415 |

OTHER PUBLICATIONS

IBM TBD vol. 27 No. 4B Sep. 84' "High Density Memory Package".
IBM TDB vol. 22 No 8A Jan. 80' "Module Test Socket".
IBM TDB vol. 13 No. 10 May 71' "Multilayer Printed Circuit Board Connections".
Albert McGovern, "Using Rigid-Flex PC Boards in a Airborne Rador System" Aug. 1991 pp. 12-15. Part I and II.

Primary Examiner—Lincoln Donovan
Assistant Examiner—Young Whang
Attorney, Agent, or Firm—William H. Steinberg

[57] ABSTRACT

A flex circuit, which is fabricated from metallization on thin film, is mounted between two opposite sides of frame to form an electronic card sized to fit as a replacement for a rigid epoxy glass card in a card carrier having a backplane. Appropriate placement of electrical components on the flex circuit and using a flex circuit longer than the spacing between the opposite sides of the frame to which the flex circuit is mounted, allows the use of taller parts on adjacent cards in the card carrier, since the flex circuit can be conformed to eliminate obstructions caused by insufficient spacing between cards.

15 Claims, 2 Drawing Sheets

FLEX CIRCUIT ELECTRONIC CARDS

BACKGROUND OF THE INVENTION

The present invention relates to electronic packaging and more specifically to an electronic card for use in card-on-board packaging.

Electronic card assemblies are typically fabricated from alternating layers of copper and epoxy glass, laminated together to form a sandwich of conductive and insulating materials. The resulting cards are very rigid which is desirable in many applications. The cards are mounted, typically with a fixed spacing between adjacent cards, through connectors to a planar board. Alternatively, the printed circuit card can be mounted between two boards with zero insertion force connectors serving the dual function of channel guides and electrical connectors. As used herein the term planar board refers to a panel made of insulating material that has circuits, electronic components, and connectors on the panel. A board, also referred to as backplane, is a panel which has connectors but does not have electronic components.

Difficulties can arise when a card needs to be upgraded for reasons of cost reduction, reliability improvements or adding additional function, since the card design is limited by the original spacing between adjacent cards. Most components, except for long lead items such as capacitors which can be bent to avoid adjacent obstructions, are rigidly mounted on circuit cards and do not allow positional adjustment to avoid interference with adjacent cards. If a heat sink or additional memory were required on a replacement card it might not fit in the spacing available, necessitating board or planar board redesign.

It is an object of the present invention to provide electronic card assemblies which eliminate many space restrictions imposed when modifying existing card-on-board designs.

SUMMARY OF THE INVENTION

In one aspect of the present invention, an electronic package is provided including a card carrier having a first and second plurality of parallel guides. The first and second plurality of guides are arranged spaced apart and facing one another. The card carrier has a plurality of cards. The cards have opposite edges removably situated in the guides. Each of the cards has electrical connector means for electrically connecting the circuits on each of the cards to a corresponding electrical connector in the card carrier. At least one of the cards has a frame, a pair of opposite edges of which are removably situated in the guides. A flex circuit is situated between opposite sides of the frame and has an overall length between the opposite sides of the frame greater than the distance between the opposite sides of the frame, so that the flex card can be conformed to any obstruction on an adjacent card in the card carrier.

DETAILED DESCRIPTION OF THE INVENTION

Figure 1:
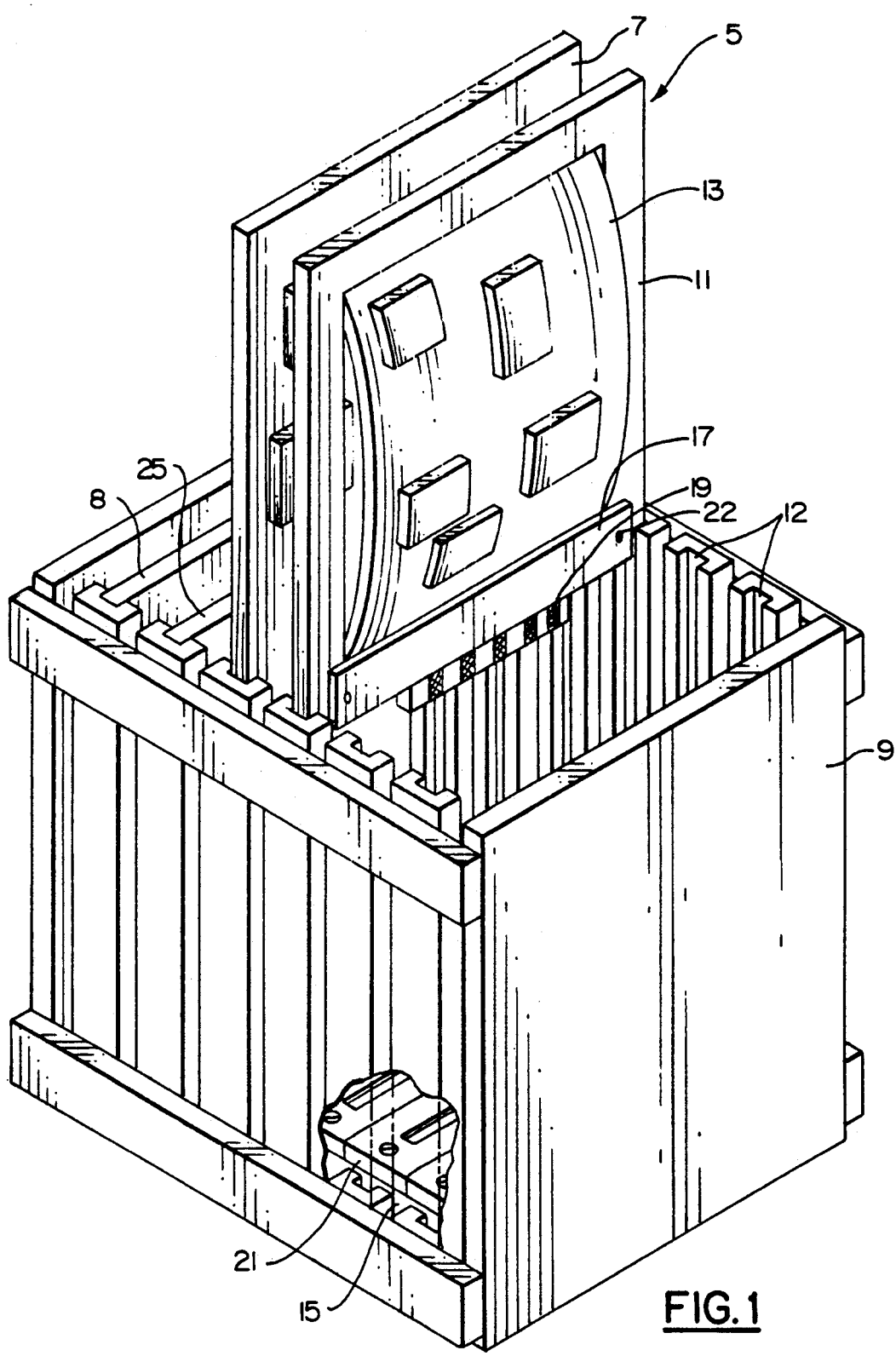
FIG. 1 is an isometric view of a card carrier, partially cut away, with a plurality of cards in accordance with the present invention.

Referring now to the drawing wherein like numerals indicate like elements throughout, and particularly FIG. 1 thereof, two adjacent circuit cards 5 and 7 are shown partially withdrawn from a card carrier 9. Card 5, in accordance with one aspect of the present invention, has a rectangular rigid frame 11. The frame can be fabricated from aluminum, for example. Guides 12 are arranged in parallel with one another on facing surfaces of opposite sides of the card carrier. The guides have channel walls which receive the side edges of the circuit cards. The guides are spaced from one another to form slots which permit the introduction and removal of cooling air. The frame provides mechanical support when handling the card during insertion and removal, and preferably has the same thickness as other printed circuit cards 7 and 8 used in the card carrier which are fabricated from laminated layers of epoxy glass and copper.

A flex circuit 13 comprising metallization on thin film, such as polyimide, is mounted in the guides, between opposite sides of the frame. Flex circuits have signal and power wiring capacity to support many applications. Flex circuits can have multiple metallization layers and a range of copper thickness's, typically 0.5 to 2 ounce copper which corresponds to a thickness of 0.0007 to 0.0028 inches, respectively. The length of the flex circuit is longer than the distance between the opposite sides of the frame allowing the flex circuit to bow. The more layers used in the flex circuit and the the thicker the copper metallization the stiffer the flex circuit portion of the card becomes. In the preferred embodiment of the present invention, the flex circuit is sufficiently stiff to hold the shape imparted to it during manufacture. A relatively stiff flex circuit has the advantage that a bend may be formed in an area where no components are soldered to the circuit and thus eliminate any stress that would occur on the solder joints. Only very light components would be mounted on thin flex circuit cards.

The flex circuit 13 is connected to a board 15 in the card carrier 9 using an epoxy glass interposer card 17. The interposer card has a connector 19 which mates with a connector 21 on the board 15. The interposer card 17 is mounted to the frame using fasteners 22, such as screws or rivets. The electrical connection between the flex circuit and the interposer card can be made by laminating the flex circuit to the interposer card, or by using solder connections or an adhesive having anisotropic electrically conductive properties to connect the aligned electrical contacts on the overlapped portions of the flex circuit and the interposer card. The connection of the flex circuit to the frame can be accomplished using fasteners through holes in the flex or by clips affixed to the frame which compress a portion of the flex circuit. An interposer card is not required if the board can accept the flex card directly and the frame can be attached to the flex card connector. The frame provides mechanical support when handling the card during insertion and removal and supports the top of the flex card so that it cannot sag or slip out of position. Depending on the weight of the components attached to the flex circuit and the stiffness of the flex circuit, the flex circuit can alternatively be supported from all sides of the frame. The frame holds the flex circuit in position in the card carrier and can be used when zero insertion force connectors are used to hold the card in its channel.

Figure 2:
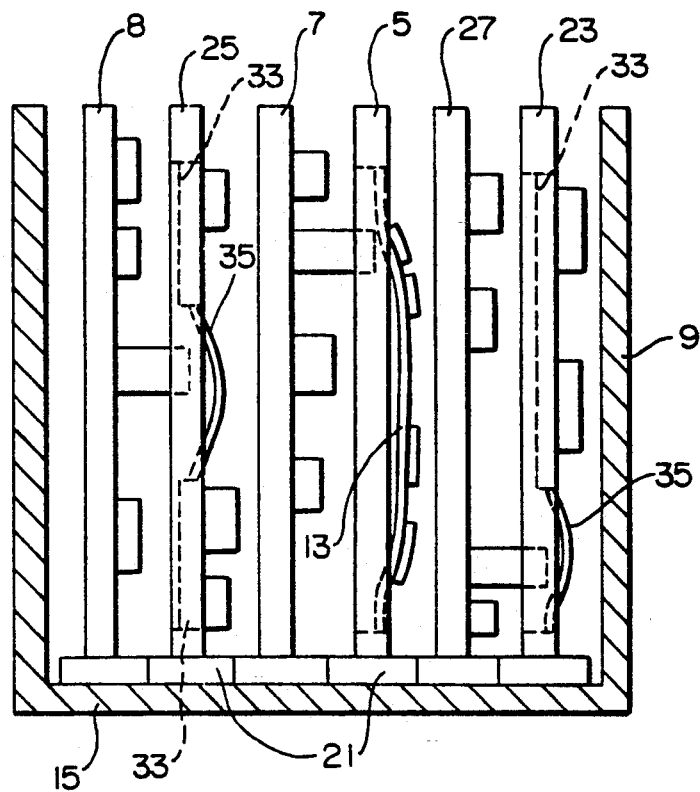
FIG. 2 is a partial side view of FIG. 1 with a wall of the card carrier removed.

Referring now to FIG. 2, the card carrier is shown with three flex circuit cards 5, 23, and 25 and three laminated epoxy glass and copper circuit cards 7, 8, and 27. When more wiring capacity is needed, or more rigidity is necessary than can be provided by flex circuit card 5, rigid-flex circuit cards such as cards 23 and 25 can be used. Rigid-flex circuit cards are fabricated with laminated layers metallization on thin film creating flexible regions 35 and additional layers of epoxy glass and copper on the metallized film layers to create rigid areas 33 The flexible regions of the rigid-flex circuit join the rigid areas together. The rigid areas allow larger electronic components and connectors to be attached and can be used on the top or bottom of the card to meet packaging requirements.

Using appropriate component placement on the flex circuit allows the use of taller components or the use of double sided packaging on adjacent standard epoxy glass cards. Flex cards which are used adjacent to epoxy glass cards are designed with approximately 1-5% additional length, for example, in situations with cards having a 4.0 inch height, a distance between cards of 0.8 inches and a single bend. In other situations, an approximation of the overall length of the flex circuit can be determined from the following formula.

$$L = (H - W^*N) + N(2B + W)$$

In the above formula L is the overall length of the flex circuit extending between the opposite sides of the frame from which the flex circuit is supported. H represents the straight line distance between the opposite sides of the frame between which the flex circuit is supported. W represents the distance a bend in the flex circuit extends in a direction parallel to the distance between the opposite sides of the frame between which the flex circuit is supported. N is the number of bends in the flex circuit, and $B = \frac{3}{4} P$, where P is the pitch or distance between adjacent cards. Card 5, for example, has one bend with a length W, which equals the straight line distance H between the opposite sides of the frame to which the flex circuit is attached.

A padded layer of dielectric material can be added, if necessary between adjacent cards to prevent electrical shorts and damage due to vibration. The mechanical support provided for the flex circuit is dependent on the original packaging approach in which it is going to be used. The rigid frame does not interfere with tall components since it is located on the perimeter of the flex circuit. As shown in FIG. 1, the flex circuit card 5 and an adjacent standard epoxy glass card 7 can be partially inserted together at the same time to avoid any interference between the frame 11 and an adjacent tall component, and then individually plugged into respective connectors 21 on the board 15. The orientation of the cards can be vertical and the orientation of the board horizontal. A vertical orientation of the board and a horizontal orientation of the cards can alternatively be used. The board can be fabricated from epoxy glass or flex. A planar board can be used if components as well as connectors are needed. Alternatively, cables can be used in place of the board or planar, if only electrical connections are needed.

The foregoing has described a circuit card which eliminates many space restrictions imposed when modifying existing card-on-board designs.

While the invention has been shown and described with reference to several preferred embodiments thereof, it will be understood by those skilled in the art that various changes in form and details may be made therein without departing from the spirit and scope of the invention.

What is claimed is:

1. An electronic package comprising:
   a card carrier including a first plurality of parallel guides and a second plurality of parallel guides, said first and second plurality of guides arranged spaced apart and facing one another, said card carrier having a plurality of electrical connectors; and
   a plurality of circuit cards each including electrical circuits, said cards having opposite edges removably situated in said guides, each of said circuit cards having electrical connector means for electrically connecting the electrical circuits on each of said cards to one of said card carrier electrical connectors, at least one of said circuit cards including a frame, said frame having opposite sides, edges of said frame being removably situated in said guides, a flex circuit mounted between opposite sides of said frame, said flex circuit having an overall length greater than the distance between the opposite sides of the frame, so that the circuit card with the flex circuit buldges out and conforms to any obstruction on the adjacent circuit card.

2. The electronic package of claim 1 wherein said flex circuit comprises metallized film with regions of the metallized film laminated with epoxy glass and copper.

3. The electronic package of claim 1 wherein the sides of said frame form a rectangle.

4. The flex circuit card of claim 1 wherein said electrical connector means is mounted on an interposer card which is rigid compared to said flex circuit, said interposer card being connected to said frame.

5. The electronic package of claim 2 wherein said electrical connector means is mounted on an interposer card which is rigid compared to the nonlaminated metallized film regions of said flex circuit, said interposer card being secured to said frame.

6. A flex circuit card for use in a card carrier having a backplane comprising:
   a frame with opposite sides, the edges of said frame positioning the frame in the card carrier;
   a flex circuit mounted between opposite sides of said frame, said flex circuit having a length greater than the distance between the opposite buldges out and allowing the flex circuit to conform carrier; and
   a connector situated on one edge of said frame for electrical attachment of said flex circuit to said backplane.

7. The flex circuit card of claim 6 wherein said flex circuit comprises metallized film with regions of the metallized film laminated with epoxy glass and copper.

8. The flex circuit card of claim 6 wherein the sides of said frame form a rectangle.

9. The flex circuit card of claim 6 wherein said connector is mounted on an interposer card which is rigid compared to said flex circuit, said interposer card being connected to said frame.

10. The flex circuit card of claim 7 wherein said connector is mounted on an interposer card which is rigid compared to the nonlaminated metallized film regions of said flex circuit, said interposer card being mounted to said frame.

11. An electronic package comprising:
a card carrier including a pair of oppositely disposed walls, a pair of facing surfaces of said walls having guides arranged in parallel, said card carrier including a plurality of electrical connectors; and
a plurality of circuit cards each including electrical circuits, said cards having opposite edges removably situated in said guides, each of said circuit cards having electrical connector means for electrically connecting the electrical circuits on each of said circuit cards to one of the card carrier electrical connectors, at least one of said circuit cards including a frame, said frame having opposite sides, edges of said frame being removably situated in said guides, a flex circuit mounted between opposite sides of said frame, said flex circuit having an overall length greater than the distance between the opposite sides of the frame, so that the circuit card with the flex circuit buldges out conforms to any obstruction on the adjacent circuit card.

12. The electronic package of claim 11 wherein said flex circuit comprises metallized film with regions of the metallized film laminated with epoxy glass and copper.

13. The electronic package of claim 11 wherein the sides of said frame form a rectangle.

14. The electronic package of claim 11 where said electrical connector means is mounted on an interposer card which is rigid compared to said flex circuit, said interposer card being secured to said frame.

15. The flex circuit card of claim 12 wherein said electrical connector means is mounted on an interposer card which is rigid compared to the nonlaminated metallized film regions of said flex circuit, said interposer card being mounted to said frame.

* * * * *